(12) United States Patent
Gunzelmann et al.

(10) Patent No.: US 7,598,893 B2
(45) Date of Patent: Oct. 6, 2009

(54) DIGITAL-TO-ANALOG CONVERTER FOR SIMULTANEOUS CONVERSION OF A PLURALITY OF DIGITAL SIGNALS

(75) Inventors: Bertram Gunzelmann, Koenigsbronn (DE); Victor Dias, Neubiberg (DE); Andreas Leyk, Dinslaken (DE); Volker Christ, Neuss (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/707,756

(22) Filed: Feb. 16, 2007

(65) Prior Publication Data

US 2007/0200743 A1   Aug. 30, 2007

(30) Foreign Application Priority Data

Feb. 17, 2006   (DE) .................. 10 2006 007 477

(51) Int. Cl.
*H03M 1/66* (2006.01)
(52) U.S. Cl. ..................... 341/144; 341/154
(58) Field of Classification Search ............ 341/144, 341/154, 141, 145
See application file for complete search history.

(56) References Cited

U.S. PATENT DOCUMENTS

| | | | | |
|---|---|---|---|---|
| 4,543,560 A | * | 9/1985 | Holloway | .............. 341/133 |
| 4,973,979 A | * | 11/1990 | Ikeda | .............. 341/154 |
| 5,252,975 A | * | 10/1993 | Yuasa et al. | .............. 341/145 |
| 5,568,147 A | * | 10/1996 | Matsuda et al. | .............. 341/154 |
| 5,977,898 A | * | 11/1999 | Ling et al. | .............. 341/144 |
| 6,163,289 A | * | 12/2000 | Ginetti | .............. 341/145 |
| 6,288,661 B1 | * | 9/2001 | Holberg | .............. 341/145 |
| 6,388,599 B2 | * | 5/2002 | Yamamoto et al. | .............. 341/154 |
| 6,590,514 B2 | * | 7/2003 | Suzuki | .............. 341/144 |
| 6,778,122 B2 | * | 8/2004 | Lien | .............. 341/154 |
| 6,870,494 B1 | | 3/2005 | Cheng et al. | |
| 7,079,062 B2 | | 7/2006 | Panov et al. | |
| 2003/0215027 A1 | | 11/2003 | Yu et al. | |
| 2005/0195098 A1 | | 9/2005 | Panov et al. | |

FOREIGN PATENT DOCUMENTS

DE   10 2004 002 013 A1   8/2005

\* cited by examiner

*Primary Examiner*—Peguy JeanPierre
(74) *Attorney, Agent, or Firm*—Slater & Matsil, L.L.P.

(57) ABSTRACT

A digital-to-analog converter has a reference value source, a reference value divider arrangement with a tap, a first switch arrangement which is designed to produce an electrical connection between the tap and a first output of the digital-to-analog converter, and a second switch arrangement which is designed to produce an electrical connection between the tap and a second output of the digital-to-analog converter.

17 Claims, 5 Drawing Sheets

Prior Art

FIG 8

Prior Art

FIG 9

Prior Art

This application claims priority to German Patent Application 10 2006 007 477.7, which was filed Feb. 17, 2006 and is incorporated herein by reference.

DIGITAL-TO-ANALOG CONVERTER FOR SIMULTANEOUS CONVERSION OF A PLURALITY OF DIGITAL SIGNALS

TECHNICAL FIELD

The present invention relates to digital-to-analog conversion.

BACKGROUND

The design trend in modern data communication systems is towards ever higher frequencies. This is also evident in the analog design, in which the maximum achievable sampling frequency is increasing further as a result of the use of ever smaller semiconductor structures. In order to allow an analog signal to be produced correctly at the output of a D/A converter, the sampling rate must be at least twice the maximum signal frequency. The suppression of the repetition spectra which are created by the sampling process is normally ensured by an analog filter.

Many data communication appliances also use digital signal processing and operate with an equivalent baseband signal in the form of an in-phase (I) and quadrature (Q) component. Two D/A converters (D/A=digital-to-analog) are therefore required for conversion of the equivalent baseband signal to the analog domain before the digital modulation onto the carrier. It is important for this modulation process to retain the orthogonality of the I and Q components.

Further applications of two D/A converters occur in audio processing. Two D/A converters are likewise required for stereophonics. Three or more D/A converters are required, in a corresponding form, for multiple-channel audio processing.

Two (or more) separate D/A converter paths may in this case be highly resource-intensive in terms of the chip area. With regard to the current that is drawn as well, two (or more) separate D/A converter paths make a major contribution to the total current drawn. The different characteristics of two D/A converters may be found to be problematic, resulting from discrepancies (mismatches) in the processing and manufacture of the semiconductor module. The different behaviour may, for example, result in distortion in relatively high-quality modulation processes. One arrangement which uses this principle for the A/D converter paths (A/D=analog-to-digital) is disclosed in U.S. Patent Application Publication 2003/0215027 A1.

Figure 9:
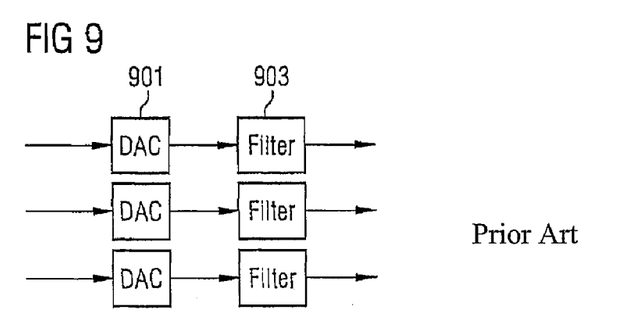
FIG. 9 shows digital-to-analog conversion of a plurality of signals.

FIG. 9 shows a block diagram of a D/A converter apparatus for multiple-channel audio processing. For each audio channel (right, left, center), the D/A converter apparatus has a D/A converter path in each case formed from a D/A converter 901 and a filter 903, connected downstream from the respective D/A converter 901, for suppression of repetition spectra.

Figure 8:
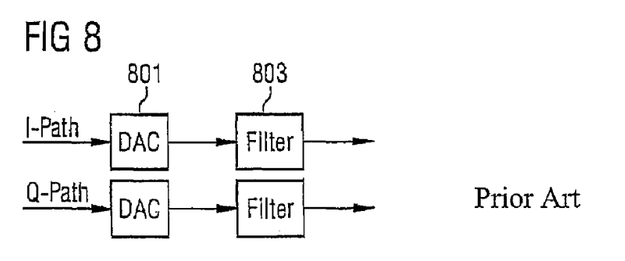
FIG. 8 shows digital-to-analog conversion of a plurality of signals.

FIG. 8 shows a block diagram of a D/A converter apparatus for the equivalent baseband modulation, in which the in-phase component (I component) and the quadrature component (Q component) are separately converted from digital to analog form and filtered. A separate D/A converter 801 and a corresponding filter 803 for suppression of the repetition spectra are therefore required for each of the digital signals (I component, Q component).

In comparison to a simple embodiment, the use of a plurality of D/A converters results in much more chip area being required. The current drawn when two or more D/A converters are used is also a multiple of when only one is used. The identical requirements for the separate channels result in very stringent requirements for the matching of the characteristics during manufacture and semiconductor processing.

Furthermore, the digital-to-analog converters provided for each of the signal processing paths must have the same response. This is particularly necessary in UMTS modules, in order to ensure that the I channel and the Q channel have characteristics which are as identical as possible. Different channel characteristics can lead to signal attenuation, to signal delays and to distortion. These effects are undesirable. A further aim is to eliminate further negative interference effects, such as common-load interference, by formation of the difference between the signals involved. In this case as well, it is desirable for the signal paths involved to have the same response.

There is therefore a general aim with integrated modules to achieve the same signal-path response by an exactly identical design of the paths involved and physical proximity on the chip. Even if it were possible to position the paths involved close together, although this would be good for the matching of the components involved, it would, however, not in fact be optimal. An exactly identical design has the disadvantage that the components must be duplicated. This consumes a larger area, and thus increases the production costs.

Figure 7:
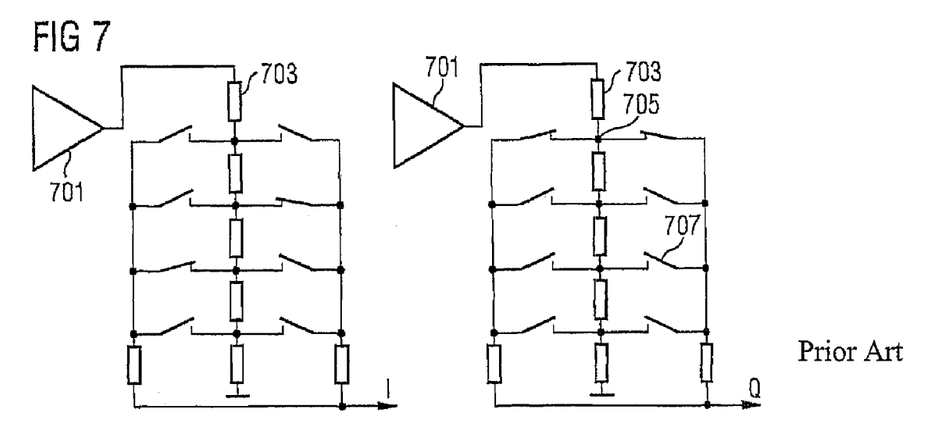
FIG. 7 shows digital-to-analog conversion of a plurality of signals.

FIG. 7 shows one possible D/A converter principle, which is based on a resistance divider using switching transistors which pass the desired voltage value to the outside. One D/A converter is provided in each case, both for the I component and for the Q component. Each of the converters has a driver 701 for production of the reference voltage for the I component and Q component, respectively. Furthermore, physically identical resistance chains 703 are provided. Taps 705 are provided between successive resistors in the respective resistance chains 703, so that an analog value which corresponds to a digital value is output when one of the switches 707 is closed. The arrangement as illustrated in FIG. 7 for digital-to-analog conversion of the I path and Q path is used, for example, in UMTS modules. If the electrical characteristics of the D/A converters illustrated in FIG. 7 differ, then this results in an undesirable mismatch between the I component and the Q component.

SUMMARY OF THE INVENTION

In one aspect, the invention provides a concept for digital-to-analog conversion of a plurality of signals using a single digital-to-analog converter.

Embodiments of the present invention are based on the discovery that a plurality of digital signals can be converted to analog signals at the same time by multiple use of the D/A converter resources.

According to one aspect, an embodiment provides a digital-to-analog converter for simultaneous conversion of a plurality of digital signals to analog signals, in which one reference source is provided for the plurality of digital signals, in order to produce an electrical reference value (for example a voltage value or a current value). The reference value source may be a single reference value source for the plurality of digital signals, for example producing a single reference value in the form of a voltage value or a current value for the plurality of signals to be converted.

The digital-to-analog converter also has a reference value divider arrangement, which divides the reference value and produces a divided reference value. The reference value divider arrangement is preferably provided for the plurality of the signals to be converted. In other words, the reference value divider arrangement is the only arrangement which has the digital-to-analog converter and produces divided reference values from the electrical reference value. In order to tap off the divided reference value, the reference value divider arrangement has a tap, or a node, at which the divided reference value can be tapped off.

The digital-to-analog converter (D/A converter) has one switch arrangement for each of the digital signals to be converted, in which case the plurality of switch arrangements can access the tap on the reference value divider arrangement independently of one another.

By way of example, the digital-to-analog converter has a first switch arrangement which produces an electrical connection between the tap on the reference value divider arrangement and a first output of the digital-to-analog converter when the divided reference value corresponds to a value of a first digital signal. Furthermore, a second switch arrangement is provided, which produces an electrical connection between the tap on the reference value divider arrangement and a second output of the digital-to-analog converter when the divided reference value corresponds to a value of a second digital signal.

Both switch arrangements therefore access the same tap in order to output the divided reference value as an analog value, which represents the respective digital signal, via the respective output. The first and the second switch arrangement produce the electrical connection for the tap, independently of one another.

By way of example, the reference value divider arrangement is composed of a single resistance chain with series-connected resistors. The tap for tapping off the divided reference value may, for example, be arranged between two adjacent resistors in the resistance chain. Depending on the number of resistors, the resistance chain has further taps for tapping off further divided reference values, in order to map different digital values onto analog values. In order to tap off the various divided reference values, the first switch arrangement may be designed to produce an electrical connection between one or more of the taps from the number of taps and the first output of the digital-to-analog converter. In a corresponding manner, the second switch arrangement produces an electrical connection between one or more taps from the number of taps and the second output of the digital-to-analog converter. This allows different digital values of different signals to be mapped independently of one another onto the respective analog divided reference values.

By way of example, the first circuit arrangement may have a number of first switches which are intended to produce electrical connections between the number of taps and the first output. In this case, one switch from the number of switches is in each case associated with one tap. If, for example, the resistance chain has four taps, then the first circuit arrangement, for example, has four switches, with each switch in each case connecting one of the taps switchably to the first output. The second circuit arrangement which, for example, is designed to be identical to the first circuit arrangement, may likewise have a number of second switches, for example four of them, which are intended to produce electrical connections between the number of taps and the second output. In this case, one switch is in each case associated with each tap.

The first or second switch arrangement as described above can now be used to output divided reference values as analog representatives of the digital values, with each divided reference value depending on the voltage division ratio in the resistance chain.

In order to allow intermediate values to be produced as well, and in order to allow the divided reference values to be tapped off in a stable form, the first switch arrangement may have a number of third switches which are intended to produce switchable electrical connections between the number of taps and the first output. In this case, each switch from the number of third switches is in each case associated with one tap. The first switch arrangement can thus access the taps using the first switches, and/or using the third switches. The first switches and the third switches can preferably be switched independently of one another. This allows different taps to be connected to the first output so that the resultant voltage represents, for example, an intermediate value between available divided reference values, thus making it possible to increase the resolution of the digital-to-analog converter. This is achieved by the capability to switch the switches independently of one another and at the same time to connect different taps to the first output. However, if corresponding first and third switches in the first circuit arrangement are closed simultaneously at the same time in order to connect the same tap symmetrically to the output, then it is possible to stabilize the value that is read.

The second circuit arrangement can likewise have a number of fourth switches which are intended to produce switchable electrical connections between the number of taps and the second output. In this case, the switches in the second switch arrangement can be switched independently of one another and of the switches in the first switch arrangement.

According to one aspect of the invention, both the first switch arrangement and the second switch arrangement may have an even number of switches, which can access the same tap. By way of example, this is the case in the exemplary embodiment described above.

The same statements also apply to the first circuit arrangement.

However, the first switch arrangement may have a further group of switches, that is to say for example a number of fifth switches, so that each tap is associated with an odd number of switches. For example, if there are three switch groups, three switches which are associated with different switch groups access the same tap independently of one another. This makes it possible to further increase the resolution of the digital-to-analog converter. This also applies to the second switch arrangement.

In order to output the analog values via the first output, the first switch arrangement can connect the outputs of the switches directly to the first output. According to an embodiment of the invention, for example, the first switches in the first switch arrangement can be coupled via a common first resistor to the first output. The first resistor in this case has a resistance which, for example, is greater than the resistance of a resistor arranged in the resistance chain. According to one aspect, the first resistor has a resistance which is greater than the maximum resistance that occurs in the resistance chain. The second switch arrangement, which may be physically identical, has a second resistor, which connects the outputs of the second switches to the second output. The statements relating to the resistance of the first resistor apply to the resistance of the second resistor, as well. In order to ensure a symmetrical design, all of the other switch groups according to this refinement are also connected to the respective output via a respective common resistor.

According to embodiments of the invention, the number of switch arrangements corresponds to the number of signals to be converted. If the digital signals are quadrature signals, then the digital-to-analog converter according to the invention has two switch arrangements and two outputs, in order to output quadrature signals which have been converted from digital to analog form. In order to control the respective switches in the respective switch arrangement, the digital-to-analog converter according to the invention may have a control device which closes or opens the respective switches as a function of a value of the respective digital signal, in order to output the analog representatives at the respective output.

According to a further aspect, the present invention provides a concept for digital-to-analog conversion of a plurality of digital signals, which concept is based on pre-processing of the data before the conversion process is carried out. According to an embodiment, the plurality of digital signals are combined to form a single signal, which is converted by a single digital-to-analog converter, thus producing an analog signal which has a plurality of analog components. The plurality of components are separated by subsequent processing of the analog signal, thus producing a plurality of analog signals which are analog representatives of the digital signals.

The digital signals may be combined to form a multiplexed signal, for example with the aid of a multiplex. If there are two digital signals, this therefore results in one multiplexed signal which alternately contains sample values of the first and of the second digital signal. However, this necessarily results in the previous time association between the sample values being resolved with respect to times because, for example, the sample values of the second digital signal are arranged after those of the first digital signal, and are thus delayed. This delay may, for example, be one sampling interval, which is predetermined by the rate at which the multiplexed signal is output. This delay contributes to the creation of an error after digital-to-analog conversion using a single digital-to-analog converter. In order to avoid this error, the invention provides a signal processing device having a delay compensator, which is provided in order to compensate for a delay by a predetermined time interval (for example by one sampling interval). The delay compensator is designed to produce a compensated sample value on the basis of one or more input sample values, in such a manner that the difference between the input sample value and a delayed sample value, which is the result of the compensating sample value being delayed by the predetermined interval, is less than the difference between the compensated sample value and the delayed sample value.

Furthermore, the signal processing device may have a multiplexer which multiplexes a plurality of signals and outputs a multiplexed signal which, for example, has sample values of a first signal and of a second signal. The multiplexing operation results in the sample values of, for example, the first signal being delayed by the predetermined interval with respect to the sample values of the second signal. The predetermined interval is, for example, governed by the output data rate of the multiplexer, and corresponds to an interval between two successive sample values in the multiplexed signal. In order to compensate for the effect of the delay, the delay compensator maps the sample values of the respective delayed signal, for example of the first or of the second signal, onto compensated sample values. If, for example, the sample values of the second signal in the multiplexed signal are delayed with respect to the sample values of the first signal, then the delay compensator supplies, as the second signal, a compensated signal which has compensated sample values which are produced from input sample values of an input signal supplied to the delay compensator.

By way of example, the signal processing apparatus may be arranged before a digital-to-analog converter which converts the multiplexed signal and the plurality of multiplexed signals in it.

According to one aspect, the signal processing device according to an embodiment of the invention has a digital-to-analog converter which is intended to convert the output signal from the multiplexer.

According to embodiments of the invention, the converted analog signal which the digital-to-analog converter outputs comprises a plurality of analog signals, with each of the analog signals representing one corresponding digital signal. In order to separate the plurality of analog signal components, the signal processing device has an extractor which, for example, produces a first and a second analog signal from the converted analog signal, which the digital-to-analog converter (D/A converter=digital-to-analog converter) outputs. In this case, the first analog signal represents the first signal which has been converted from digital to analog form and comprises the multiplexed signal emitted from the multiplexer. The second analog signal in contrast represents the D/A converted second signal, which is contained in the multiplexed signal.

The extractor may have a first and a second hold element for extraction of the analog first and second signal. The two hold elements receive the converted analog signal and alternately hold it for a predetermined time interval, in order to output the first or the second analog signal. The hold elements may, for example, have one or more capacitances which are intended to receive the values of the converted analog signal and to hold them alternately until emitted analog signals can be detected on the output side.

In order to avoid repetition spectra, filters, for example, in the form of low-pass filters or bandpass filters, can be provided on the output side.

As has already been described above, the multiplexer composes the multiplexed signal from a plurality of digital signals. If, for example, this is a digital quadrature signal with an in-phase component and with a quadrature component, then the quadrature signal is described by a sample-value pair in the digital domain. The combined sample values of the in-phase components and of the quadrature components thus occur at the same time. This time relationship is lost after the multiplexing operation because, for example, the sample values of the quadrature component are delayed with respect to the sample values of the in-phase components. In order nevertheless to allow the respective sample values to be made available at the correct sampling rate, the multiplexer is designed to output the multiplexed signal at a rate which is a multiple of the rate which was originally associated with the respective signals. For example, the multiplexer is designed to receive the sample values of the first signal or of the second signal at a first rate, and to output the sample values of the multiplexed signal at a second rate, which is a multiple of the first rate. The rate multiplication factor is preferably equal to the number of digital signals to be converted. The rate is therefore double, if there are two signals.

According to one embodiment of the invention, the signal processing device may also have a delay element which is intended to delay that signal which is not passed to the delay compensator, in order to compensate for the processing delay in the delay compensator. If, for example, the second signal is passed to the delay compensator, then the delay element is provided in order to delay the first signal by a processing time interval which the delay compensator requires to produce the compensated signal on the basis of the second signal and to produce the compensated sample value. No additional and undesirable delay is therefore introduced. The delay element is, for example, in digital form and has a control input to which a control signal can be applied, which can be used to adjust the desired delay. However, the delay may be fixed in advance. Furthermore, in order to produce this and further control signals, a control unit may be provided which sets the desired delay of the delay element as a function of the method of operation of the delay compensator.

By way of example, the delay compensator may carry out an interpolation process in order to produce the compensated sample value between sample values of an input signal. The time interval between the compensated sample value and one of the support points, that is to say one of the sample values of the input signal, depends for example on the predetermined time interval by which the compensated sample value is subsequently delayed (for example because of the multiplexing operation), or is identical to this time interval. The interpolation process thus results in intermediate values which can be selected as compensated sample values. By way of example, the selection operation may be carried out by the multiplexer as described above. According to a further aspect, the signal processing device may also have a selector which selects the interpolated values in order to produce the selected values as the compensated sample values.

According to a further embodiment of the invention, the delay compensator can be designed to oversample the input signal which is supplied to the delay compensator, in order, on the basis of the oversampling, to produce intermediate values which are emitted as compensated sample values. According to one embodiment, for example, the delay compensator can oversample all of the signals to be converted (for example by an oversampling factor which is equal to the number of signals to be converted). By way of example, a selector can produce the oversampled values and sample values obtained by the oversampling process as compensated sample values for each signal to be converted or for a plurality of signals to be converted. A downstream selector may, for example, be designed to select the compensated sample values for the respective signal, and to pass the compensated sample values to, for example, the multiplexer. The selection of the compensated sample values depends on the time interval by which the respective signal is delayed after the multiplexing operation relative to a signal which is contained in the multiplexed signal and, for example, has not been delayed.

According to a further aspect, the signal processing apparatus has a modulator which, for example, carries out a modulation process during which a group of bits is mapped onto a modulation symbol. By way of example, the modulator may be a PSK modulator or a QAM modulator. If the modulator is intended to map the group of bits onto a complex-value modulation symbol, then this group of bits is normally represented by two values, which represent the modulation symbol, to be precise, its real part and its imaginary part, in the complex domain. The modulation symbol is thus formed by a sample-value pair. A series of modulation symbols is represented by the two parallel signals, with each of the signals having sample values which are associated either with the real part or with the imaginary part of the modulation symbols.

If modulation symbols are sampled at the same time, then, according to an embodiment of the present invention, one of the signals which, for example, represents the real part or the imaginary part, is delayed with respect to the respective other signal. In order to compensate in advance for this delay, the delay compensator described above can, according to one aspect, be connected downstream from the modulator. The sample values which the modulator produces are thus input sample values for each element connected downstream from the modulator. The successive output modulation symbols are thus represented by input sample values and by further input sample values. By way of example, the delay compensator according to an embodiment of the invention is intended to receive the input sample values or the further input sample values and to produce sample values which have been compensated on the basis of them and can be passed together with the respective non-compensated input sample values to the multiplexer, which generates the multiplexed signal, which can subsequently be converted using a single digital-to-analog converter.

However, the production of the complex-value sample values may in fact be taken into account during the mapping of the group of bits onto the modulation symbol. In this case, the delay compensator at the same time acts as a modulator and produces a compensated modulation symbol in which, by way of example, the real part is selected from a standard modulation alphabet, and in which, for example, the imaginary part is produced directly as a compensated sample value, in contrast to the standard modulation alphabet. For this purpose, for example, the modulator can take account of successive groups of bits in order to produce the instantaneous compensated sample value as a function of previous or subsequent sample values which can be expected.

BRIEF DESCRIPTION OF THE DRAWINGS

Further exemplary embodiments of the invention will be explained with reference to the attached drawings, in which.

DETAILED DESCRIPTION OF ILLUSTRATIVE EMBODIMENTS

Figure 1:
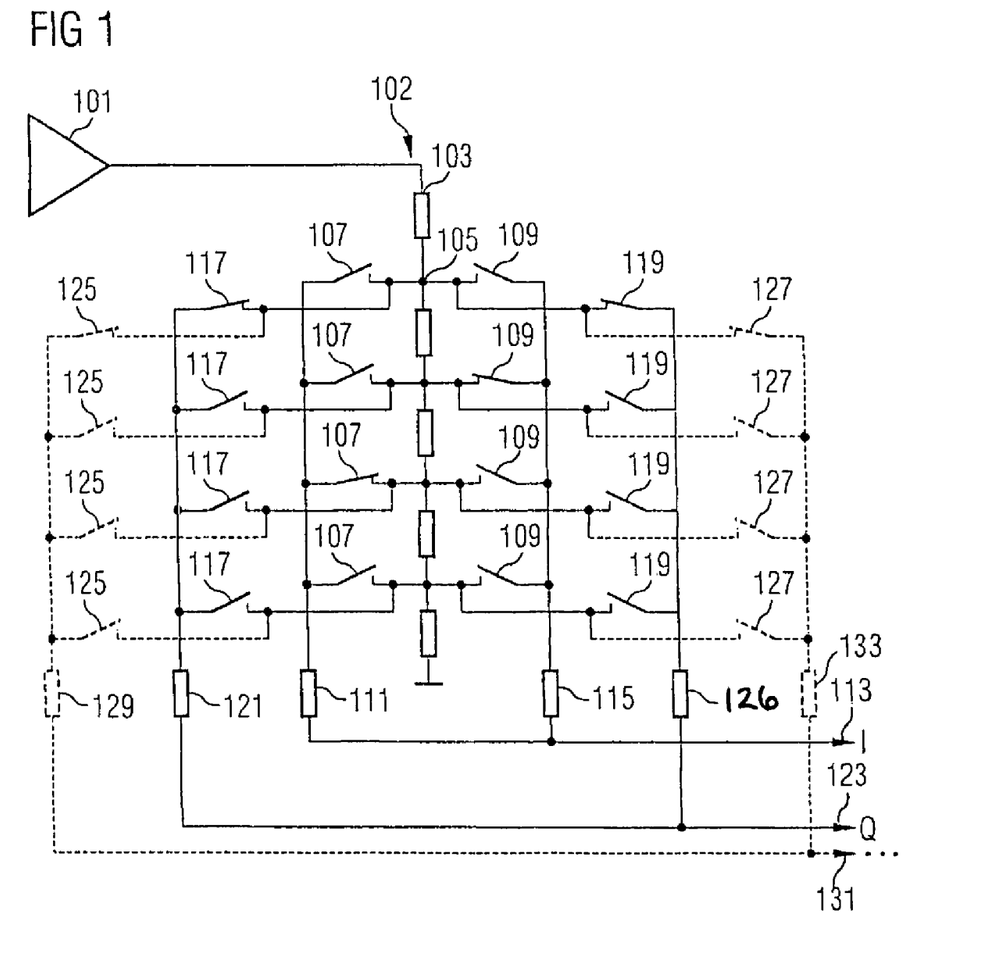
FIG. 1 shows a digital-to-analog converter according to one exemplary embodiment of the invention.

FIG. 1 shows one exemplary embodiment of a digital-to-analog converter for simultaneous conversion of a plurality of digital signals to analog signals, according to one embodiment of the invention.

The converter has a reference value source 101, for example a driver for a reference voltage, which is provided for the plurality of signals to be converted. By way of example, the reference value source 101 is intended to produce the reference value both for the I path and for the Q path when quadrature components are being converted. One output of the reference source 101 is connected to one connection of the reference value divider arrangement 102 which, for example, comprises series-connected resistors 103. Taps 105 are provided between successive resistors 103, and the divided reference values can be tapped off from these taps 105.

The digital-to-analog converter (D/A converter) also has a first switch arrangement with first switches 107 and with third switches 109. The switches 107 in the first switch arrangement are connected via a resistor 111 to a first output 113. The third switches 109 in the first switch arrangement are connected to the output 113 via a resistor 115.

The D/A converter also has a second switch arrangement, with second switches 117 and fourth switches 119. The second switches 117 and the fourth switches 119 are connected to the taps 105, as illustrated in FIG. 1. The second switches 117 are connected to a second output 123 via a resistor 121. The fourth switches 119 in the second switch arrangement are connected to the second output 123 via a resistor 126.

Analog output signals are produced at the outputs 113 and 123 and, for example, represent a converted quadrature signal with the I and Q components.

The D/A converter also has a third switch arrangement with fifth switches 125 and sixth switches 127. The switches 125 are connected to a further output 131 via a resistor 129, and the sixth switches 127 are also connected to this output 131, via a resistor 133.

The resistors 111, 115, 121, 126, 129 and 133 may have identical or different resistances. The resistances of these resistors are greater than the resistances of the resistors 103 which are arranged in the resistance chain.

The third switch arrangement is intended to convert a third digital signal from digital to analog form. The switches in the fifth and sixth switch groups (switch arrangement) are for this purpose connected to the respective taps, so that the voltages which can be tapped off at the taps and represent the divided reference values are passed to the further output 131.

All of the switches in the first, the second and the third switch arrangements may either be connected in pairs at the same time, or independently of one another. Both situations are illustrated in FIG. 1. A third switch 109 in the first switch arrangement is closed while the opposite switch 107, which can be switchably connected to the same tap, is open. Furthermore, a further switch 107 is connected to a further tap. This means that further intermediate values can be produced and provided.

The exemplary embodiment illustrated in FIG. 1 demonstrates the principle according to the invention of using only one resistance chain with a driver 101 for a number of, for example, identical digital-to-analog converter elements, each of which has an associated switch arrangement. Furthermore, each of the switch arrangements can be controlled by a control device which receives the digital signals and opens or closes the switches as a function of the digital signal values. The switches in each of the switch arrangements may, for example, be in the form of transistors.

The D/A converter principle according to an embodiment of the invention, as illustrated in FIG. 1, is based on a single resistance divider with, for example, switching transistors which connect the desired voltage value to the outside, in which case, according to the invention, finer intermediate values can also be produced by additional voltage division. The drive according to an embodiment of the invention of an I path and a Q path uses one and the same resistance divider and driver. The switches in the two channels connect the desired voltage values to their outputs independently of one another. Furthermore, for example, since only voltages are switched, this allows simultaneous switching.

Figure 2:
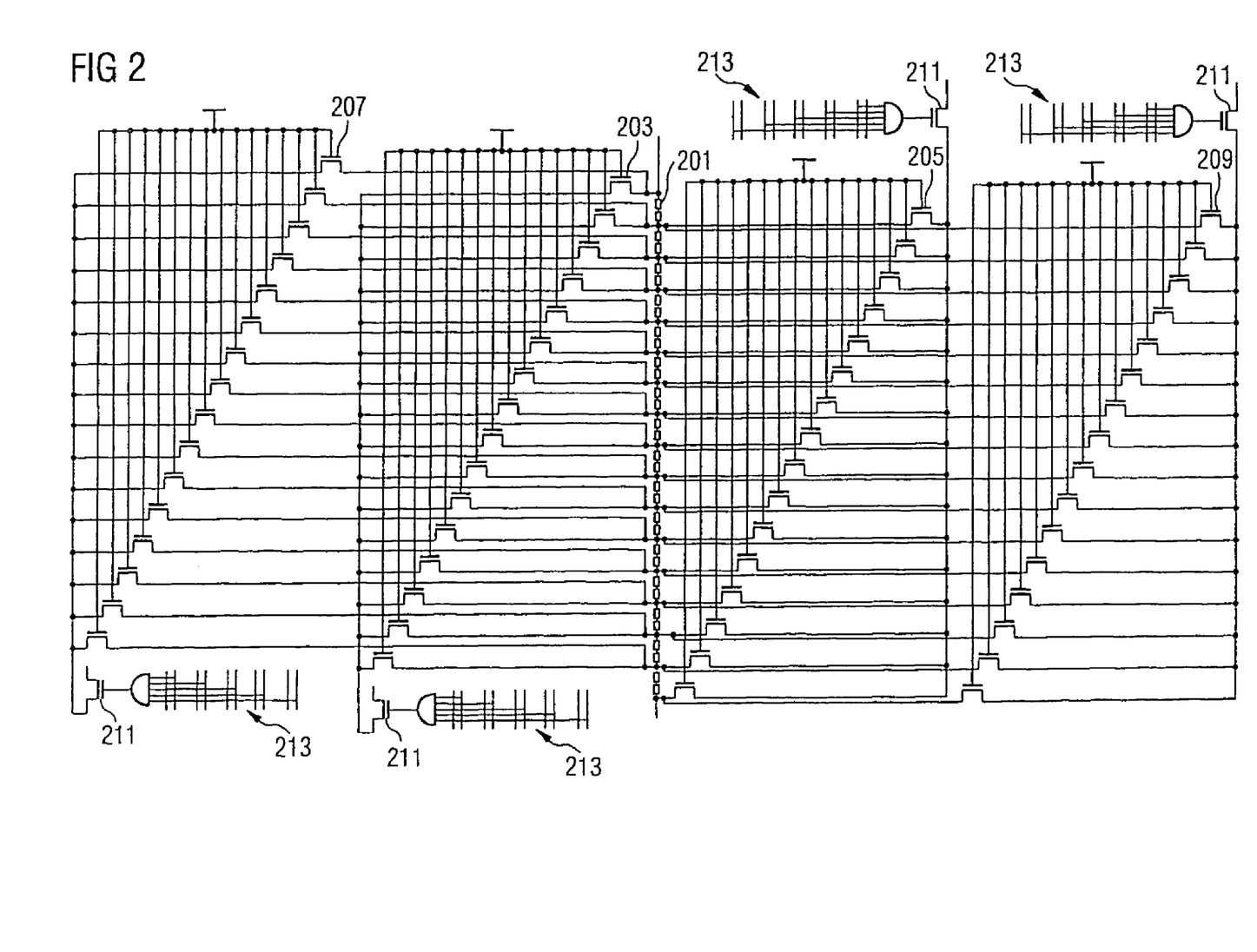
FIG. 2 shows a digital-to-analog converter according to a further exemplary embodiment of the invention.

FIG. 2 shows a digital-to-analog converter according to a further exemplary embodiment of the invention. The digital-to-analog converter (D/A converter) has a resistance chain 201 with a first switch arrangement comprising first switches 203 and third switches 205. The D/A converter also has a second switch arrangement with second switches 207 and fourth switches 209. The switches in the two switch arrangements are in the form of transistor switches, whose gate connections are in each case connected together. The switching transistors each have first connections, which are connected to corresponding taps which are provided between resistors in the resistance chain 201. Second connections of the respective switches are in each case connected together, and are in each case connected via a transistor 211 to an address gate 213. Each switch arrangement has two address gates 213, which are connected to the respective switches via the transistors 211. By way of example, the switches are in the form of NMOS field-effect transistors. By way of example, the address gates 213 may be NAND gates, which are used for addressing purposes. The resistance chain illustrated in FIG. 2 with duplicated circuitry can be used, for example, for an I channel and a Q channel in a UMTS module.

Figure 3:
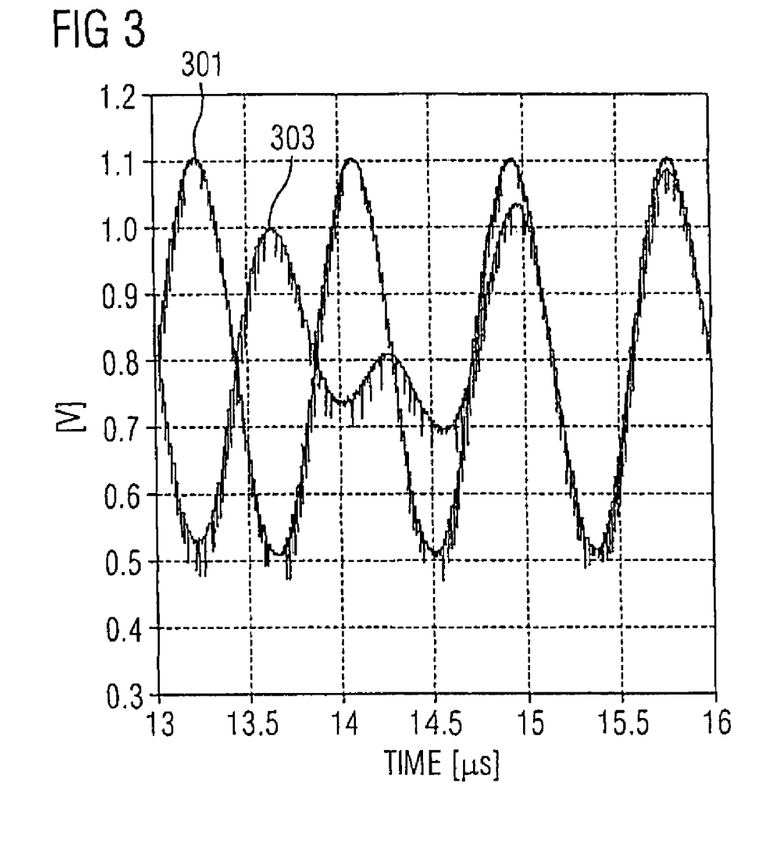
FIG. 3 shows signal waveforms of signals converted at the same time.

FIG. 3 shows the waveforms of various independent signals from a single resistance chain which, for example, have been produced using the converter illustrated in FIG. 1. As illustrated in FIG. 3 on the basis of a first analog signal 301 and a second analog signal 303, different signals can be converted at the same time and independently of one another. The signals can be smoothed by the provision of filters on the output side, for example by means of low-pass filtering. The two signals may, for example, be voltage signals.

Figure 4:
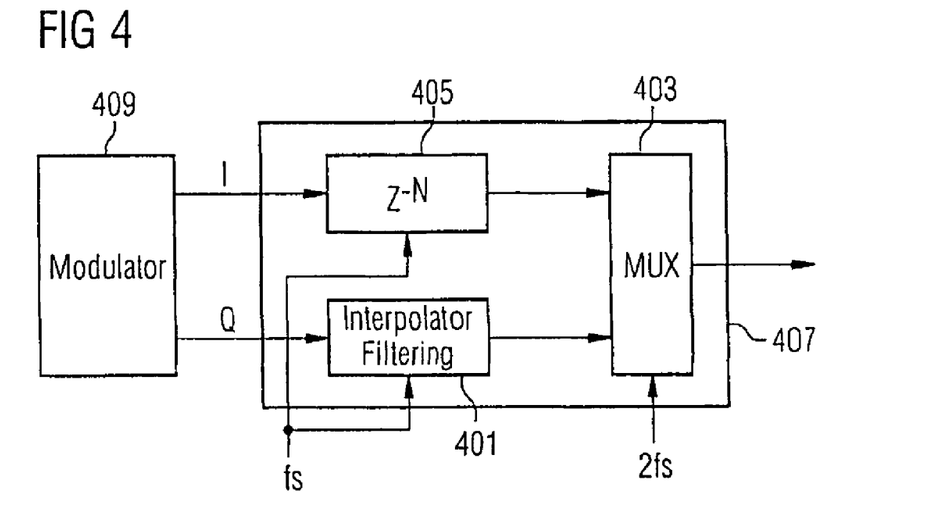
FIG. 4 shows a signal processing device according to one exemplary embodiment of the present invention.

According to a further aspect of the present invention, the signal processing device illustrated in FIG. 4 may be used for conversion of a plurality of digital signals, using a single digital-to-analog converter, in which case the conversion process can be carried out in the equivalent baseband.

The signal processing device has a delay compensator 401, a multiplexer 403 and a delay element 405. The elements 401, 403 and 405 are combined to form a processing unit 407 which, for example, may be provided in a digital signal processor (DSP). The delay element 405 is intended to produce a delay by N clock cycles (with the sampling frequency being fs) in order to compensate for the processing delay which is associated with the production of the compensated sample value by the delay compensator 401. By way of example, the delay compensator 401 carries out an interpolation and a filtering process. The output signal from the delay compensator 401 and the output signal from the delay element 405 are supplied to the multiplexer 403, which is clocked at twice the sampling frequency fs, and which outputs a multiplexed signal.

FIG. 4 also shows a modulator 409 which, for example, may be a component of the signal processing device. The modulator 409 may, however, also be an external element. In this case, the signal processing device corresponds to the processing unit 407. The modulator 409 outputs digital I data and Q data, for example, which in each case comprises sample values which, for example, form (in pairs) a modulation symbol.

Figure 5:
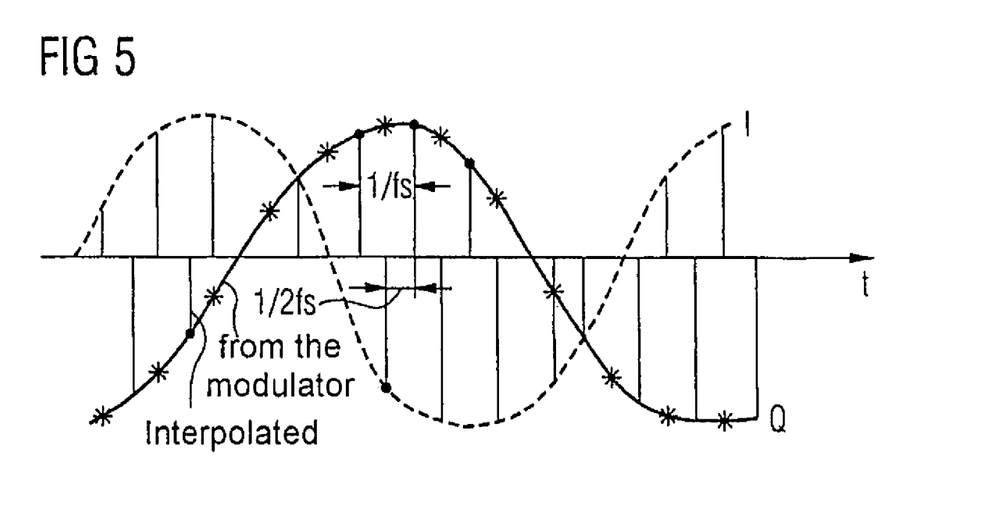
FIG. 5 shows a profile of the Q component after interpolation.

The digital I data and Q data is supplied to the processing unit (DSP) 407 at a sampling frequency fs, with a delay by half of one clock cycle occurring between the clock cycles of the blocks for interpolator/filtering 401 and delay ($Z^{-N}$). The Q data is interpolated in the DSP 401 in order to generate appropriate intermediate values of the discrete-time signal. The interpolation/filtering normally generates an intermediate value of two sample values, which corresponds exactly to the sample value at this time. However, for simplicity, it is assumed here that this intermediate sampling time corresponds to a frequency 2 fs. This is illustrated by way of example in FIG. 5 for the quadrature component Q. The sampling times which are annotated with "*" are sampling times which, for example, are predetermined by the modulator. The vertical bars arranged in between them in contrast indicate the times at which interpolated (that is to say compensated) sample values are produced.

The delay block 405 (delay ($Z^{-N}$)) delays the I signal by an amount which is comparable to the processing time of the interpolator/filtering block. The two blocks are clocked at a frequency fs, with fs corresponding at least to twice the highest signal frequency that occurs. The virtual half clock cycle is compensated for again by alternately tapping off the I and Q signals at the frequency 2 fs by the block MUX 403.

Figure 6:
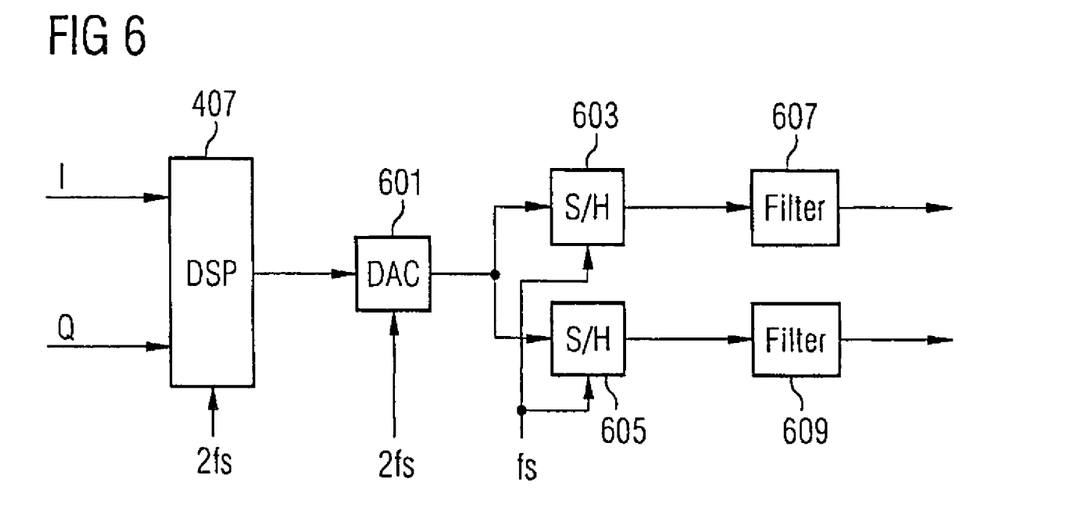
FIG. 6 shows a signal processing device according to a further exemplary embodiment of the invention.

FIG. 6 shows a further exemplary embodiment of a signal processing device according to the invention with the processing unit 407 (DSP), which receives an in-phase component I and a quadrature component Q of a quadrature signal. The processing unit processes the data at, for example, twice the sampling frequency 2 fs. The multiplexed signal at the output of the processing unit 407 is passed to a digital-to-analog converter 601, which is likewise operated at twice the sampling frequency 2 fs. One output of the digital-to-analog converter 601 (D/A converter) is connected to one input of a first hold element 603 and to one input of a second hold element 605. One output of the first hold element 603 is connected to a filter 607, which is intended for the I path. One output of the second hold element is connected to a filter 609, which is intended for the Q path. The hold elements 603 and 605 may, for example, be in the form of sample and hold (S/H) elements, and may be operated at the sampling frequency fs itself.

The output signal from the block DSP 407 is supplied to the D/A converter block 601 at a sampling rate 2 fs. The analog I data and Q data is supplied to the sample and hold blocks (S/H). The two S/H blocks operate at the sampling frequency fs, with the two clocks being delayed by half a clock cycle. The analog data is thus held alternately via the S/H blocks. The following filter blocks suppress the repetition spectra.

According to the invention, a single D/A converter path is used to convert a plurality of signals. For example, this may be duplicated in an equivalent baseband system. One D/A converter path, for example for multiple-channel audio signals, can also likewise be used in a corresponding manner more than once by time-division multiplexing. Alternatively, the interpolation, as calculated in the block DSP (407), to the intermediate values can also be carried out directly by the modulator. In the modulator (not illustrated in detail), the source bits are normally mapped onto a constellation diagram, and are spectrally weighted by a filter. The filter function can then also carry out the interpolation function.

A further possibility is direct generation of the modulator data at the higher frequency 2 fs. Every alternate sample value in the I path and Q path is then rejected, in each case using the respective other value in the Q path to that in the I path.

As a simplification of the arrangement, the S/H block 603, 605 may also be in the form of a single capacitance. Its object is to hold the output voltage from the D/A converter at the input of the output filter (filter block).

The function of the S/H blocks 603, 605 and filters 607, 609 is further simplified by the sampling frequency fs being considerably higher than the highest signal frequency that occurs (high oversampling ratio). In this situation, the S/H block does not require any corresponding subsequent filtering. The single hold function results in a sinc(f) function in the frequency domain which, although it produces little attenuation in the frequency domain, nevertheless ensures adequately good suppression of the repetition spectra, however, as a result of the high oversampling ratio. The dedicated filter blocks are therefore not required.

As a further embodiment, it is also possible to use only parts of the D/A converters jointly. In the case of an R string D/A converter, for example, the resistance network can thus be used jointly. The read arrangement may exist individually for each path. Furthermore, the converter as described above from FIG. 1 can also be used as the D/A converter 601.

Until now, D/A converters, for example, in the I path and Q path of a UMTS module have each used their own resistance chain and their own driver to supply voltage to the chain. Both occupy a significant area. When a single driver is used with only one resistance chain for all the D/A converters (for example both for the I path and for the Q path), this avoids virtually all of the matching problems. The chip area is reduced considerably, and the current which would be required for the second chain with the driver, which is missing, is saved. This principle can also be used for any desired number of identical D/A converters.

What is claimed is:

1. A digital-to-analog converter for simultaneous conversion of a plurality of digital signals to analog signals, the digital-to-analog converter comprising:

a reference value source for producing an electrical reference value;

a reference value divider arrangement for producing a divided reference value from the electrical reference value, the reference value divider arrangement having a tap for tapping off the divided reference value;

a first switch arrangement, designed producing an electrical connection between the tap on the reference value divider arrangement and a first output of the digital-to-analog converter when the divided reference value corresponds to a value of a first digital signal; and a second switch arrangement, producing an electrical connection between the tap on the reference value divider arrangement and a second output of the digital-to-analog converter when the divided reference value corresponds to a value of a second digital signal, the first switch arrangement and the second switch arrangement producing the electrical connections independently of one another, wherein the first switch arrangement has a number of first switches for producing electrical connections between the number of taps and the first output, with one tap from the number of taps in each case being associated with one switch, and wherein the second switch arrangement has a number of second switches for producing electrical connections between the number of taps and the second output with one tap from the number of taps in each case being associated with one switch from the number of second switches, wherein the reference value divider arrangement has a number of taps for tapping off the number of different divided reference values, with the first switch arrangement producing an electrical connection between one or more taps from the number of taps and the first output of the digital-to-analog converter, and with the second switch arrangement producing an electrical connection between one or more taps from the number of taps and the second output of the digital-to-analog converter.

2. The digital-to-analog converter according to claim 1, wherein the reference value divider arrangement has a single resistance chain with series-connected resistors, with the tap being arranged between two adjacent resistors in the resistance chain.

3. The digital-to-analog converter according to claim 2, wherein the first switch in the first switch arrangement is coupled via a common first resistor to the first output, the first resistor having a greater resistance than a resistor arranged in the resistance chain, and wherein a second switch in the second switch arrangement is coupled via a common second resistor to the second output, the second resistor having a greater resistance than a resistor arranged in the resistance chain.

4. The digital-to-analog converter according to claim 1, wherein the first switch arrangement has the number of third switches for producing switchable electrical connections between the number of taps and the first output, with each switch from the number of third switches being associated with one tap, and with the first switches and the third switches being switchable independently of one another, in order to increase the resolution of the digital-to-analog converter.

5. The digital-to-analog converter according to claim 4, wherein the second circuit arrangement has a number of fourth switches for producing switchable electrical connections between the number of taps and the second output, with the second and the fourth switches being switchable independently of one another.

6. The digital-to-analog converter according to claim 5, wherein the first circuit arrangement has a number of fifth switches, each tap being associated with an odd number of switches in the first circuit arrangement.

7. The digital-to-analog converter according to claim 1, further comprising:
   a first sample and hold element coupled to the first output; and
   a second sample and hold element coupled to the second output.

8. The digital-to-analog converter according to claim 7, wherein
   the first and second switch arrangements are configured to be clocked at twice a sampling rate;
   the first and second sample and hold elements are configured to be clocked at the sampling rate; and
   a clock of the second sample and hold element is configured to be delayed by a half clock cycle with respect to the first sample and hold element.

9. The digital-to-analog converter according to claim 1, wherein the first output and the second output form time multiplexed signals corresponding to the first digital signal and the second digital signal.

10. The digital-to-analog converter according to claim 1, wherein the first and second digital signals comprise quadrature components of a quadrature signal.

11. The digital-to-analog converter according to claim 1, further comprising a digital signal processing unit configured to produce the first digital signal and the second digital signal, the digital signal processor comprising:
   a delay element comprising a first signal input and a first signal output, the delay element configured to provide a delayed representation of the first signal input at the first signal output;
   an interpolation filter comprising a second signal input and a second signal output, the interpolation filter configured to provides an interpolated representation of the second signal input at the second signal output;
   a multiplexer comprising
      a first input coupled to the first signal output,
      a second input coupled to the second signal output,
      an output configured to provide the first digital signal and the second digital signal in a time multiplexed manner.

12. The digital-to-analog converter according to claim 11, wherein the first and second signal inputs are configured to be coupled to an in-phase and a quadrature signal.

13. A digital-to-analog converter comprising:
   a time multiplexer comprising a first and second input clocked at a first frequency, and a time multiplexed output clocked at twice the first frequency;
   a number of voltage taps;
   a first set of switches coupled to the plurality of voltage taps;
   a second set of switched coupled to the plurality of voltage taps;
   a first output node coupled to the first set of switches, wherein the first set of switches is configured to be switched according to a first value of the time multiplexed output; and
   a second output node coupled to the second set of switches, wherein the second set of switches is configured to be switched according to a second value of the time multiplexed output, wherein
      the first set of switches has a number of first switches for producing electrical connections between the number of voltage taps and the first output node, with one voltage tap from the number of voltage taps being associated with one switch from the number of first switches, and
      the second set of switches has a number of second switches for producing electrical connections between the number of voltage taps and the second output node, with one voltage tap from the number of voltage taps being associated with one switch from the number of second switches.

14. The digital to analog converter of claim 13, wherein the first input to the time multiplexer comprises an in-phase component and second input to the time multiplexer comprises a quadrature component.

15. The digital to analog converter of claim 13, further comprising a plurality of series resistors coupled to a reference voltage, wherein the nodes between each resistor comprise the number of voltage taps.

16. The digital to analog converter of claim 13, further comprising:
   a first sample and hold coupled to the first output; and
   a second sample and hold coupled to the second output.

17. The digital to analog converter of claim 13, wherein the time multiplexer comprises a delay element coupled to the first input of the time multiplexer, and an interpolation element coupled to the second input of the time multiplexer, wherein the time multiplexed output is configured to alternate between an output of the delay element and an output of the interpolator.

* * * * *